(12) United States Patent
Barker

(10) Patent No.: US 6,570,516 B1
(45) Date of Patent: May 27, 2003

(54) MULTI-OUTPUT DAC AND METHOD USING SINGLE DAC AND MULTIPLE S/H CIRCUITS

(75) Inventor: Gary R. Barker, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/133,720

(22) Filed: Apr. 26, 2002

Related U.S. Application Data

(60) Provisional application No. 60/332,321, filed on Nov. 9, 2001.

(51) Int. Cl.[7] .............................................. H03M 1/00
(52) U.S. Cl. ...................................... 341/122; 341/144
(58) Field of Search ................................ 341/144, 122, 341/118, 155

(56) References Cited

U.S. PATENT DOCUMENTS

| | | | | |
|---|---|---|---|---|
| 4,585,956 A | * | 4/1986 | Lie ............................. | 327/95 |
| 5,623,300 A | * | 4/1997 | Itoh et al. ................... | 347/237 |
| RE37,716 E | * | 5/2002 | Sutardja et al. ............. | 341/120 |
| 6,483,448 B2 | * | 11/2002 | Martin et al. ................ | 341/123 |

OTHER PUBLICATIONS

SMP08 Octal Sample–and Hold with Multiplexed Input, Analog Devices, Inc., 1996, pp. 1–8.
DAC8228 Dual 8–Bit CMOS D/A Converter with Voltage Output, Analog Devices, Inc., pp. 1–12, 1996.

* cited by examiner

Primary Examiner—Peguy Jeanpierre
(74) Attorney, Agent, or Firm—W. Daniel Swayze, Jr.; W. James Brady; Frederick J. Telecky, Jr.

(57) ABSTRACT

A single-DAC, multiple sample/hold conversion circuit includes a digital-to-analog converter and a plurality of sample/hold circuits each including an output amplifier, first and second hold capacitors coupled to inputs of the output amplifier and to terminals of and first and second sampling switches. An operational transconductance amplifier (OTA) has a first input coupled to an output of the digital-to-analog converter. A feedback switch is coupled between a second input of the OTA and the output of the output amplifier. A control circuit closes the feedback switch, first switch, and second switch of a sample/hold circuit selected according to an address input supplied to the control circuit.

26 Claims, 7 Drawing Sheets

MULTI-OUTPUT DAC AND METHOD USING SINGLE DAC AND MULTIPLE S/H CIRCUITS

This application claims the benefit of provisional application No. 60/332,321 filed Nov. 9, 2001.

BACKGROUND OF THE INVENTION

The invention relates to a sample and hold circuit architecture that reduces pedestal error, offset error, droop error, and linearity errors, and relates especially to a plurality of such sample and hold circuits having inputs multiplexed to the output of a single DAC or other analog signal source. The invention also relates to a plurality of such sample and hold circuits having outputs multiplexed to the input of a single ADC.

It is well known that a single DAC, multiple sample/hold conversion circuit can have a number of advantages, including reduced integrated circuit die size and cost, improved channel-to-channel matching, improved integrated circuit yield, and reduced component trimming time, testing time, and cost. Despite these advantages of single DAC, multiple sample/hold conversion circuit, performance limitations on the capabilities of known sample/hold circuits have prevented more widespread use thereof. Specifically, known sample/hold circuits are subject to switching transient errors, pedestal errors, offset errors, and droop errors totaling approximately 50 millivolts, which limits the use of such known sample/hold circuits in single DAC, multiple sample/hold circuits to approximately 10 bit accuracy. Also, hold times of only a few microseconds are typical for known sample/hold circuits, and such short hold times necessitate use of high speed DAC for a single DAC, multiple sample/hold conversion circuit applications. The short hold times also necessitate a high refresh rate, which greatly increases power consumption, and also limits the number of sample/hold outputs that can be provided for the single high-speed DAC. Furthermore, the required high refresh rate greatly increases the number of transient impulses that appear at the sample/hold outputs per unit of time, and this increases the amount of switching noise and necessitates more complex filtering of the sample/hold outputs.

FIG. 1 illustrates what is believed to the closest prior art. Referring to FIG. 1, a single DAC, multiple sample/hold conversion circuit 1 includes a DAC 8228 digital-to-analog converter 2 (available from Analog Devices Inc.) having its output coupled to the input of an SMP08 circuit 3 (also available from Analog Devices Inc.) including multiple sample/hold circuits. Each of the eight sample/hold circuits in block 3 includes a switch 6, a hold capacitor 8, and an output amplifier 7. Typically, one terminal of the switch 6 is connected to the (+) input of the operational amplifier 7 and to one terminal of a hold capacitor 8. The other terminal of each switch 6 is connected to the output 5 of DAC 2. An address decoder 4 controls which one of switches 6-1,2 . . . 8 is closed to charge the corresponding hold capacitor 8-1,2 . . . 8 to the output voltage of DAC 2. The digital inputs of DAC 2 can receive digital input signals from any of a number of sources, and a corresponding address is applied to the input of address decoder circuit 4 to determine which sample/hold circuit in block 3 samples and stores the analog output into which the present digital input is converted. The output of each amplifier 7 provided as feedback to the (−) input of that amplifier to thereby configure the amplifier as a unity gain buffer.

The prior art single DAC, multiple sample/hold conversion circuit 1 of FIG. 1 has several shortcomings. One is that there is no cancellation of pedestal errors which appear as an offset of the output voltage due to switching charge that is distributed onto the hold capacitor 8 of a sample/hold circuit when its input switch 6 is opened. Another shortcoming is that charge on the hold capacitor 8 is slowly discharged through parasitic leakage paths during the hold mode of each sample/hold circuit, causing "droop" of the output voltages (on conductors 9-1,2 . . . 8) of the sample/hold circuit 3 during their respective hold modes. A third shortcoming of the prior art single DAC, multiple sample/hold circuit 1 of FIG. 1 is that there is no mechanism for reducing linearity errors due to non-linearity of the output amplifier of the sample/hold circuit. Note that in the prior art sample/hold circuits the settling time and accuracy are limited by the amount of time required to fully charge the hold capacitor, and the voltage drop across the sampling switch has fallen to zero by the time the hold capacitor is fully charged. In the prior art sample/hold circuits, errors related to offset, linearity, and input common mode of the op-amp are translated directly to the output of the sample/hold circuit.

Another shortcoming of the prior art single DAC, multiple sample/hold conversion circuit of FIG. 1 is that channel-to-channel crosstalk and hold time reduction result from the large range of signals that appear at the DAC output 5 in FIG. 1 and at the input of each sample/hold "channel" during its hold mode while other digital input signals are converted by DAC 2 during the acquire mode of the other channels. For example, sample/hold output 9-1 can be "programmed" to be +2.5 volts by a particular digital input converted by DAC 2 such that hold capacitor 8-1 is charged to +2.5 volts, and then sampling switch 6-1 is turned off. Sample/hold output 9-2 then is programmed to be −2.5 volts by another digital input digitized by DAC 2 such that hold capacitor 8-2 is charged to −2.5 volts and sampling switch 6-2 is turned off. While the analog value for the second channel including sample/hold output 9-2 is being "acquired", i.e., is being sampled and held, sampling switch 6-1 has a voltage of +5 volts across it, which causes a significant corresponding leakage current that reduces the charge on hold capacitor 8-1, contributing to the voltage droop of sample/hold output 9-1 in the positive direction during the time that the analog value to be output on conductors 9-2 is being acquired. Thus, opposite polarities of the two sample/hold output voltages result in opposite polarity output voltage droop contributions, and each sample/hold output voltage is affected by the values of the other sample/hold outputs in a sort of pseudo-random way. Therefore, the output voltage droop of each sample/hold circuit during its hold mode is unpredictable and its slope varies depending on the values and acquisition timing of the other sample/hold outputs.

Thus, there is an unmet need for an improved sample and hold circuit architecture that provides reduced pedestal error, offset error, droop error, and linearity error and does not exhibit channel-to-channel interaction.

There also is an unmet need for an improved sample and hold circuit architecture which provides reduced pedestal error, offset error, droop error, and linearity error and does not exhibit channel-to-channel interaction in a single DAC, multiple sample/hold conversion circuit including a plurality of such sample and hold circuits having inputs multiplexed to the output of a single DAC.

There also is an unmet need for an improved sample and hold circuit architecture which provides reduced pedestal error, offset error, droop error, and linearity error and does not exhibit channel-to-channel interaction in a single DAC, multiple sample/hold conversion circuit including a plurality of such sample and hold circuits having inputs multiplexed to the output of a single DAC and also provides rejection of various common-mode noise signals.

There also is an unmet need for an improved sample and hold circuit architecture which provides reduced pedestal error, offset error, droop error, and linearity error in a single ADC, multiple sample/hold conversion circuit including a plurality of such sample and hold circuits having outputs multiplexed to the input of a single ADC.

SUMMARY OF THE INVENTION

Accordingly, it is an object of the invention to provide an improved sample and hold circuit architecture which provides reduced pedestal error, offset error, droop error, and linearity error.

It is another object of the invention to provide an improved sample and hold circuit architecture which provides reduced pedestal error, offset error, droop error, and linearity error and which also provides rejection of common-mode noise.

It is another object of the invention to provide an improved sample and hold circuit architecture which provides reduced pedestal error, offset error, droop error, and linearity error in a single DAC, multiple sample/hold conversion circuit including a plurality of such sample and hold circuits having inputs multiplexed to the output of a single DAC.

It is another object of the invention to provide an improved sample and hold circuit architecture which provides reduced pedestal error, offset error, droop error, and linearity error in a single ADC, multiple sample/hold conversion circuit including a plurality of such sample and hold circuits having outputs multiplexed to the input of a single ADC.

It is another object of the invention to provide a programmable, multi-function integrated circuit including an improved sample and hold circuit architecture which provides reduced pedestal error, offset error, droop error, and linearity error in single DAC, multiple sample/hold conversion circuitry including a plurality of such sample and hold circuits having inputs multiplexed to the output of a single DAC and in a plurality of such sample and hold circuits having outputs multiplexed to the input of a single ADC.

Briefly described, and in accordance with one embodiment thereof, the invention provides a sample/hold circuit including an output amplifier (70), a first hold capacitor (81) coupled to a first input (+) of the output amplifier (70) and a first terminal of a first sampling switch (60), a second hold capacitor (80) having a first terminal coupled to a second input (−) of the output amplifier (70) and to a first terminal of a second sampling switch (61) and a second terminal coupled to an output (9) of the output amplifier (70), and a feedback element coupled to the output (9) of the output amplifier (70). An operational amplifier (11) includes a first input (+) for receiving an analog input voltage, a second input (−), a first output (19A) coupled to a second terminal of the first sampling switch (60), and a second output (19B) coupled to a second terminal of the second sampling switch (61), the second input (−) of the operational amplifier (11) being coupled to the feedback element. An element is coupled to control elements of the first and second sampling switches for conducting a switch control signal for closing the first and second sampling switches to cause the sample/hold circuit to sample the analog input voltage by charging the first and second hold capacitors to voltages on the first and second outputs of the operational amplifier, respectively, and for opening the first and second sampling switches to cause the sample/hold circuit to hold the sampled analog input voltage.

In another embodiment, the invention provides a multiple sample/hold circuit including a plurality of sample/hold circuits (90) each including an output amplifier (70), a first hold capacitor (81) coupled to a first input of the output amplifier and a first terminal of a first sampling switch (60) and a second terminal coupled to an output (9) of the output amplifier, and a feedback switch (16) having a first terminal coupled to the output of the output amplifier. An operational transconductance amplifier (11) has first (+) and second (−) inputs, a first output connected to a second terminal of the first switch (60), the second input (−) of the operational transconductance amplifier being coupled to a second terminal of the feedback switch (16). A control circuit applies a selected analog signal (18A) to the first input of the operational transconductance amplifier and receives an address input (17) and selects one of a plurality of switch control buses (14) in response to the address input. Each switch control bus is coupled to control the feedback switch (16), first switch (60), and second switch (61) of a corresponding sample/hold circuit (90), the control logic circuit (15) producing switch controls signals on the selected switch control bus to control the feedback switch (16) and first switch (60) of the corresponding sample/hold circuit (90).

In the described embodiment, the sample/hold circuits (90) each include a first hold capacitor (81) coupled to a first input (+) of the output amplifier and a first terminal of a first sampling switch (60), a second hold capacitor (80) having a first terminal coupled to a second input (−) of the output amplifier and to a first terminal of a second sampling switch (61) and a second terminal coupled to an output (9) of the output amplifier, and a feedback switch (16) having a first terminal coupled to the output of the output amplifier. The control logic circuit (15) producing switch controls signals on the selected switch control bus to control the second switch (61) of the corresponding sample/hold circuit (90). Each of the first (60) and second (61) sampling switches includes first (69) and second (66) N-channel transistors each having a gate connected to a control signal (S) and first (71) and second (65) P-channel transistors each having a gate coupled to a logical complement ($\overline{S}$) of the control signal, the first N-channel transistor (69) having a first electrode coupled to the second terminal of the first sampling switch and a second electrode coupled to a first electrode of the second N-channel transistor (66), a body electrode of the first N-channel transistor (69) being coupled to a low supply voltage ($V_{EE}$), a second electrode of the second N-channel transistor (66) being coupled to the first terminal of the first sampling switch, the first P-channel transistor (71) having a first electrode coupled to the second terminal of the first sampling switch and a second electrode coupled to a first electrode of the second P-channel transistor (65), a second electrode of the second P-channel transistor (65) being coupled to the first terminal of the first sampling switch, a body electrode of the first P-channel transistor (71) being coupled to a high supply voltage ($V_{CC}$).

In one described embodiment, control circuitry (15) includes digital data control circuitry for routing a digital data input signal (33) to an input (13A) of a digital-to-analog converter (2) to cause the digital-to-analog converter to produce the selected analog signal (18A) signal on the first input (+) of the operational transconductance amplifier (11). In another described embodiment, the control circuitry (15A) includes a first demultiplexer (96) for switching a selected analog signal onto the first input (+) of the operational transconductance amplifier in response to the address input and a second demultiplexer (27) for switching the output of a selected sample/hold circuit to an input of the analog-to-digital converter in response to the address input. The control circuitry (15) includes digital data control circuitry for routing a digital data input signal (33) to an input (13A) of a digital-to-analog converter (2) to cause the digital-to-analog converter to produce the selected analog signal (18A) signal on an input of the first demultiplexer (96). In one described embodiment, the control circuitry (15) includes register circuitry (40) coupled to receive a digital output signal produced by the analog-to-digital converter (99) and circuitry programmable to refresh a particular sample/hold circuit (70) by applying the digital output signal in the register circuitry (40) to the digital input of the digital-to-analog converter (2) and switching the output of the digital-to-analog converter through the first demultiplexer (96) to the first (+) of the operational transconductance amplifier.

DETAILED DESCRIPTION OF THE PREFERRED EMBODIMENTS

Figure 1:
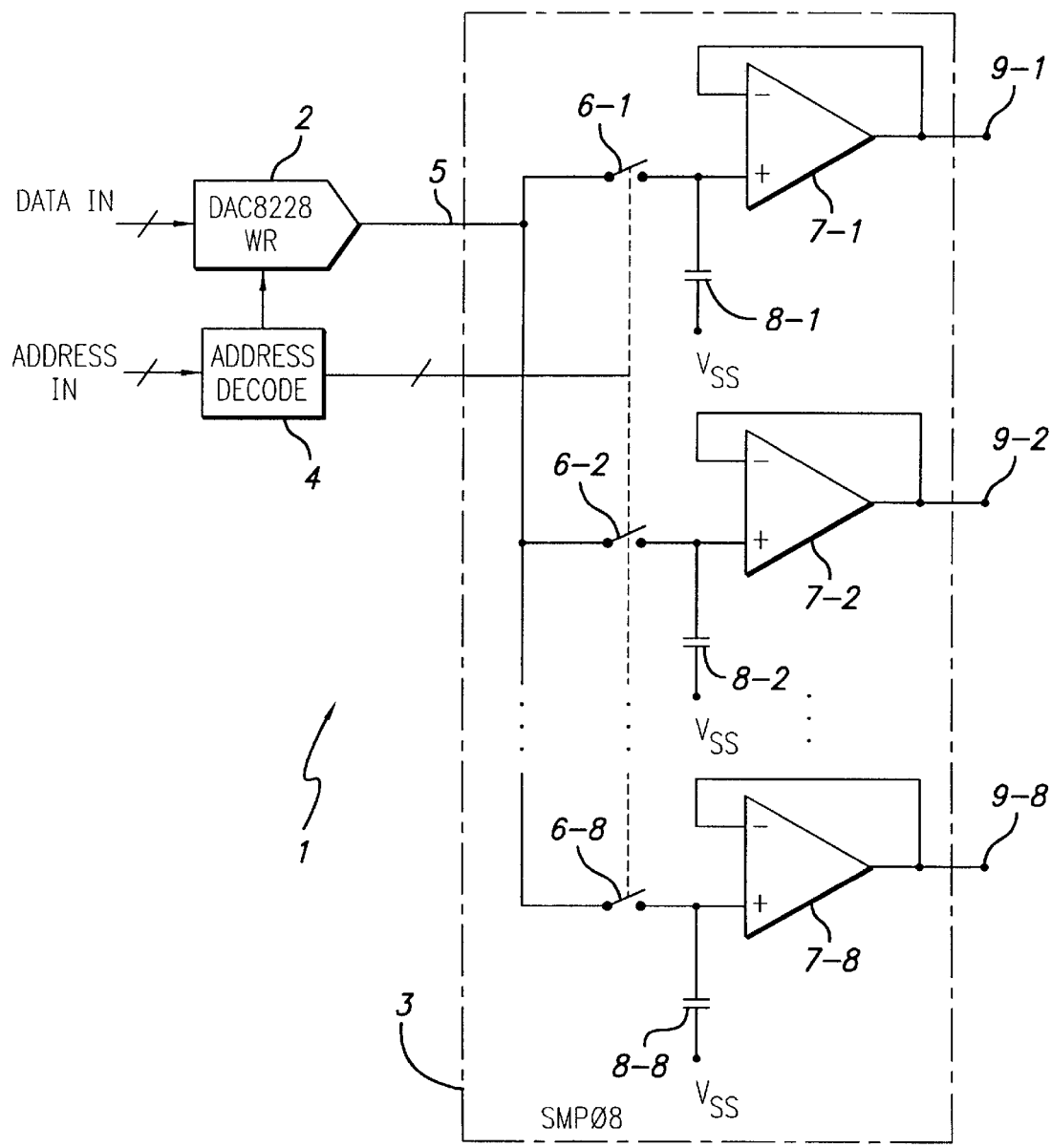
FIG. 1 is a block diagram of a prior art single DAC, multiple sample/hold conversion circuit.
Figure 2A:
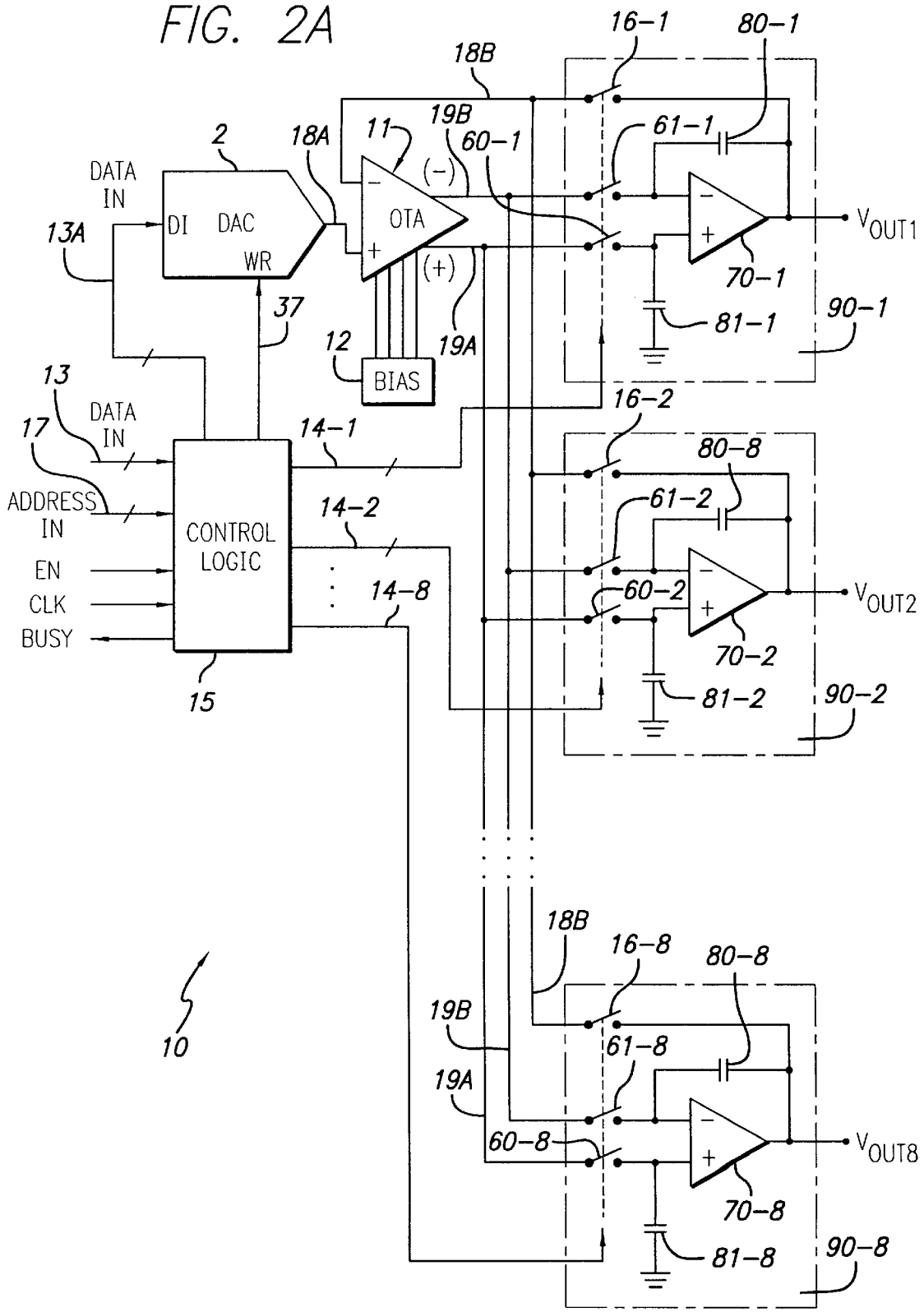
FIG. 2A is a block diagram of the single DAC, multiple sample/hold conversion circuit of the present invention.

Referring to FIG. 2A, single DAC, multiple sample/hold conversion circuit 10 includes a DAC (digital-to-analog converter) 2 having a data input DI connected by bus 13A to the output of the control logic circuit 15 by a data bus 13A. A write input WR of DAC 2 is connected by a conductor 37 to an output of control logic circuit 15. The write signal WR informs DAC 2 that digital input data is valid and cause it to perform the digital-to-analog conversion. The output 18A of DAC 2 is connected to the (+) input of an operational transconductance amplifier (OTA) 11. OTA 11 has several bias voltage inputs connected to a bias circuit 12. OTA 11 has a (+) output connected by conductor 19A to an input of each of eight sample/hold circuits 90-1,2 . . . 8 (collectively referred to herein by reference numeral 90 alone) and a (−) output connected by conductor 19B to another input of each of the eight sample/hold circuits 90-1,2 . . . 8.

Only sample/hold circuit 90-1 will be described in detail, as it is essentially identical to the other sample/hold circuits 90-2,3 . . . 8. Sample/hold circuit 90-1 includes an output amplifier 70-1 having an output 9-1 connected to one terminal of a hold capacitor 80-1 and to one terminal of a feedback switch 16-1. The other terminal of feedback switch 16-1 is connected by conductor 18B to the (−) input of OTA 11. The output voltage Vout1 is produced on sample/hold output conductor 90-1. The other terminal of hold capacitor 80-1 is connected to the (−) input of output amplifier 70-1 and to one terminal of a sampling switch 61-1. Output amplifier 70-1 also includes a (+) input connected to one terminal of a hold capacitor 81-1 and to one terminal of a sampling switch 60-1. The other terminal of hold capacitor 81-1 is connected to ground or other fixed reference voltage.

The other terminal of sampling switch 60-1 is connected to conductor 19A, and the other terminal of sampling switch 61-1 is connected to conductor 19B. Sampling switch 60-1, sampling switch 61-1 and feedback switch 16-1 are connected, respectively, to control logic circuit 15 by corresponding conductors of switch control bus 14-1. Sample/hold circuits 90-2,3 . . . 8 are configured essentially identically to sample/hold circuit 90-1, and are similarly connected to conductors 19A, 19B, and 18-B. Sample/hold circuits 90-2,3 . . . 8 also are similarly connected to corresponding output conductors 9-2,3 . . . 8 and switch control buses 14-2,3 . . . 8.

Sampling switches 60-1 and 61-1 and feedback switch 16-1 can be simultaneously closed in order to cause sample/hold circuit 90-1 to sample the analog output of OTA 11, and the same switches can be simultaneously opened in order to cause sample/hold circuit 90-1 to hold the sample analog voltage. The control signals applied to the control the electrodes of feedback switches 16-1,2 . . . 8 should be non-overlapping in order to prevent any of the output conductors 9-1,2 . . . 8 from being short-circuited. Parasitic capacitances associated with conductors 18A, 18B, 19A and 19B in FIG. 2A can be used to prevent the outputs of OTA 11 from changing during the relatively short non-overlapping intervals during which all of feedback switches 16-1,2 . . . 8 are open. Alternatively, an "always on" feedback loop can be provided having a high impedance output to ensure that OTA 11 always remains in a closed feedback loop, irrespective of the timing of the opening and closing of the sampling switches 60 and 61 and the feedback switches 16. In this way, OTA 11 is still in a closed feedback loop while being switching from one sample/hold channel to another.

Figure 7A:
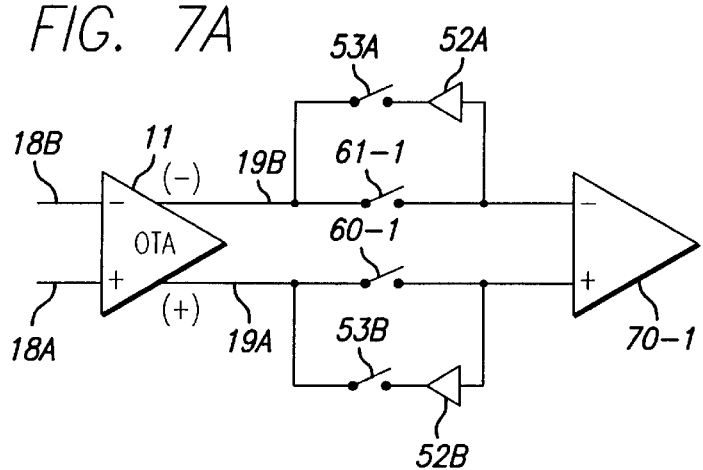
FIG. 7A is a schematic diagram illustrating one way of achieving continuous feedback in the embodiment of FIG. 2A.

FIG. 7A illustrates another way of preventing the outputs of OTA 11 from becoming unstable during the non-overlapping intervals in which all of feedback switches 16-1,2 . . . 8 are open. In FIG. 7A, a unity gain buffer amplifier 52A has its input connected to the right terminal of sampling switch 61-1 and its output connected to one terminal of a switch 53A having its other terminal connected to conductor 19B. Similarly, a unity gain buffer amplifier 52B has its input connected to the right terminal of sampling switch 60-1 and its output connected to one terminal of a switch 53B having its other terminal connected to conductor 19A. Alternatively, the right sides of unity gain buffers 52A and 52B may be connected to any source that causes OTA outputs 19A and 19B to be clamped to their common-mode voltage. Switches 53A and 53B are closed whenever all of the sampling switches 60-1,2 . . . 8 and 61-1,2 . . . 8 are open. Under these conditions, unity gain buffers 52A and 52B overdrive the high impedance (−) and (+) outputs, respectively, of OTA 11 and thereby clamp the voltages of OTA outputs 19A and 19B to the voltages on the (−) and (+) inputs of output amplifier 70-1, irrespective of feedback on conductor 18B.

Figure 7B:
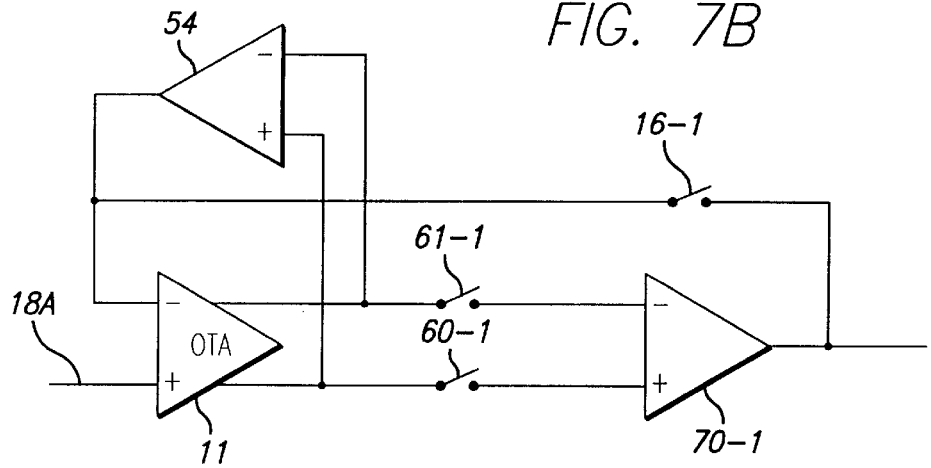
FIG. 7B is a schematic diagram illustrating another way of achieving continuous feedback in the embodiment of FIG. 2A.

FIG. 7B illustrates another way of preventing the outputs 19A and 19B of OTA 11 from becoming unstable during the non-overlapping intervals in which all of the feedback switches and sampling switches are open, by connecting conductor 19B to the (−) input of an operational amplifier 54 having its output connected to the (−) input of OTA 11. Conductor 19A is connected to the (+) input of operational amplifier 54. When feedback switch 16-1 is closed, output amplifier 70-1 overdrives the output of operational amplifier 54 in order to provide the needed feedback to the (−) input of OTA 11.

Control logic circuit 15 receives various digital input data words DATA IN on data bus 13, stores each input data word, and outputs it on bus 13A to the input of DAC 2 at an appropriate time. Control logic circuit 15 also receives ADDRESS INPUT on address bus 17 for selecting which of sample/hold circuits 90-1,2 . . . 8 is to sample and hold the present analog value produced on conductor 18A by DAC 2. Control logic circuit 15 receives a clock signal CLK. Control logic circuit 15 provides an interface to a user for writing the desired digital data corresponding to the desired output (address) into DAC 2 and ensuring that the corresponding analog output signal appears on the desired output terminal 9, and makes the fact that there is an architecture including only one DAC and a plurality of sample/hold circuits transparent to the user.

Figure 2B:
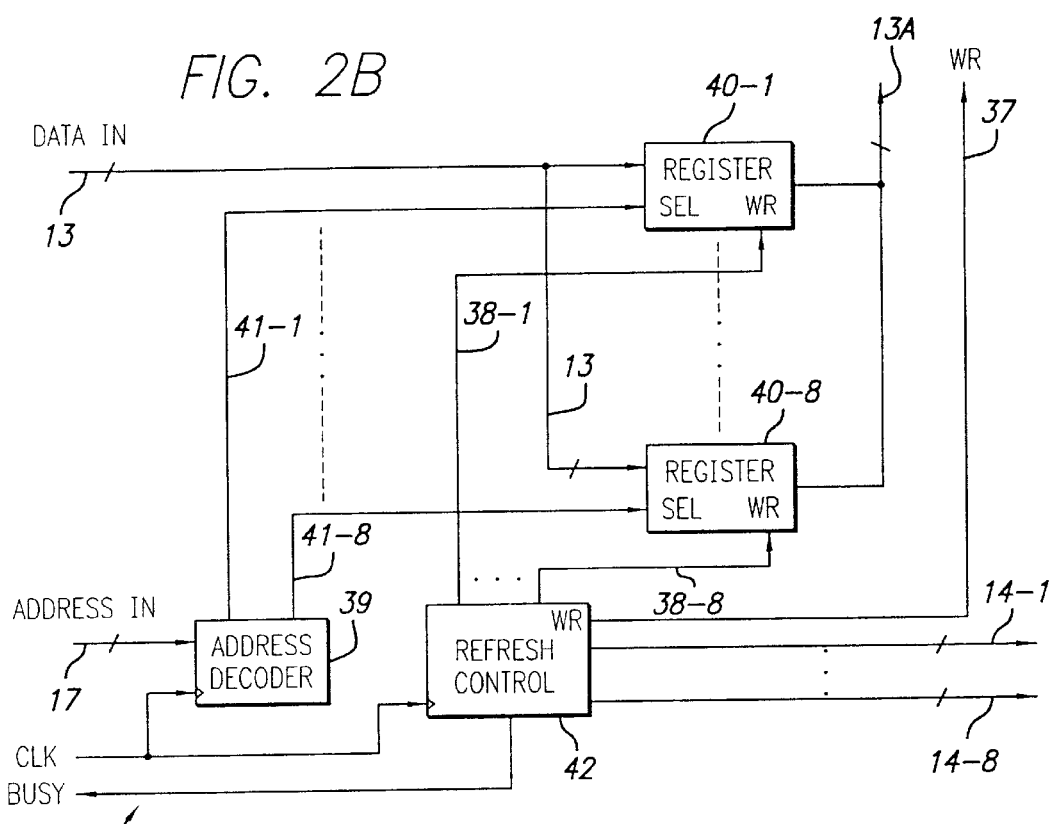
FIG. 2B is a detailed block diagram of one implementation of the control logic circuit 15 shown in FIG. 2A.

As shown in FIG. 2B, control logic circuit 15 includes an address decoder 39 having its address inputs connected to ADDRESS IN bus 17 and a clock input connected to CLK. Control logic circuit 15 also includes eight data registers 40-1,2 . . . 8 for storing eight different digital input words, and also includes a refresh control circuit 42. The DATA IN signal on bus 13 is applied to data inputs of the eight data registers 40-1,2 . . . 8. Address decoder 39 decodes ADDRESS IN to produce one of eight selection signals on a selected one of conductors 41-1,2 . . . 8, which are connected to the selection inputs SEL of registers 40-1,2 . . . 8, respectively, in order to determine which of the eight data registers 40-1,2 . . . 8 is being selected. A refresh control circuit 42 has a clock input connected to receive CLK, and produces a busy signal BUSY when the selected register is currently being read from. Refresh control circuit 42 produces write signals on eight conductors 38-1,2 . . . 8 that are applied to the WR (write) inputs of data registers 40-1,2 . . . 8, respectively, in order to write the value of DATA IN stored in the selected one of registers 40-1,2 . . . 8 to the input DI of DAC 2. Data registers 40-1,2 . . . 8 have digital inputs which are connected to digital bus 13A, so that various digital words represented by DATA IN on bus 13 are input to and stored in corresponding data registers 40-1,2 . . . 8 in accordance with values of ADDRESS IN decoded by and decoder 39 as each digital input word is presented to the registers 40-1,2 . . . 8 in accordance with ADDRESS IN and control signals from refresh control circuit 42. The stored digital words subsequently are output on digital bus 13A in accordance with write signals applied to the WR input of DAC 2 by address decoder 39 as a result of decoding ADDRESS IN and a corresponding write signal is produced on conductor 37 by refresh control circuit 42 to cause DAC 2 to accept the digital word on bus 13A. Refresh control circuit 42 also produces the selected switch control signals on switch control buses 14-1,2 . . . 8.

Refresh control circuit 42 also includes circuitry that controls the refresh cycle to cause sample/hold circuit output 9 to be refreshed within a certain time period as needed to satisfy specific application requirements. Refresh control circuit 42 also includes circuitry that controls which register is outputting digital data words to be converted to the desired analog output, and also controls the acquire/hold timing of the corresponding output amplifier 70. Refresh control circuit 42 also controls the timing of the opening and closing of the sampling switches and feedback switches such that at least one output is in the acquisition mode, i.e., such that the OTA 11 is never in an open feedback loop. Refresh control circuit 42 also controls timing of the reading from and writing to DAC 2.

Thus, and in accordance with the present invention, differential OTA 11 provides a mechanism for continuous feedback from the output of the presently selected sample/hold circuits 90-1,2 . . . 8 to correct for linearity errors of the output amplifiers 70-1,2 . . . 8 and linearity errors of the sampling switches 80-1,2 . . . 8 and 81-1,2 . . . 8. Also, OTA 11 and feedback switches 16-1,2 . . . 8 operate to compensate for the input offset voltage of OTA 11. The differential structure of OTA 11 provides common mode rejection of typical noise associated with clock signals, power supplies, and other common mode noise sources. The use of differential OTA 11 as shown in combination with two hold capacitors 80 and 81 in each sample/hold circuit 90 results in improved output voltage droop performance and improved pedestal performance of the sample/hold circuits 90. The differential configuration improves sample/hold output voltage droop, pedestal error rejection, common-mode noise rejection, and, to some extent, reduction in switching transient signals.

The use of two hold capacitors 80 and 81 provides Miller compensation for the sample/hold circuit during its acquisition mode. This is important, because although the additional gain provided by OTA 11 results in improved accuracy, it also tends to make the sample/hold circuit unstable during the acquisition mode unless compensation is provided. Capacitor 80 provides the needed feedback compensation.

The dominant leakage paths causing the above mentioned sample/hold output voltage droop are in the sampling switches, assuming the output amplifier 70 input transistors are of CMOS circuitry, or assuming some form of bias current reduction technique is applied to bipolar input transistors. If only a single hold capacitor is used, the leakage current in the single sampling switch changes the charge on the single hold capacitor, causing a direct change in the sample/hold output voltage. In the differential configuration using two hold capacitors 80 and 81 as shown in FIG. 2A, leakage currents of equal magnitude and polarity flow into or out of both hold capacitors, and this results in direct translation of changes in the voltages across the two differentially connected hold capacitors 80 and 81 to the sample/hold output voltage of equal but opposite magnitude.

If only a single hold capacitor is used, part of the field effect transistor channel charge that dissipates when the sampling switch is opened is collected on the single hold capacitor, resulting in a DC offset on the output. However, in the differential hold capacitor configuration shown in FIG. 2A, the two sampling switches 60 and 61 inject equal charges on the two hold capacitors 80 and 81, and since the effects to the output of the injected charges on the hold capacitors are equal and opposite, the result is an effective cancellation of the DC offset that represents the pedestal error. Thus, sample/hold output voltage droop cancellation and the pedestal error cancellation are the result of the same differential charge cancellation mechanism, and in the same way, any common mode signals and common mode charge injection (such as noise and switching transients) are attenuated by differential charge cancellation at the output. This is in addition to the common-mode noise rejection inherent in the differential architecture of the sample/hold circuit, specifically, the common-mode-rejection of the OTA 11 and especially output amplifier 70.

Figure 3:
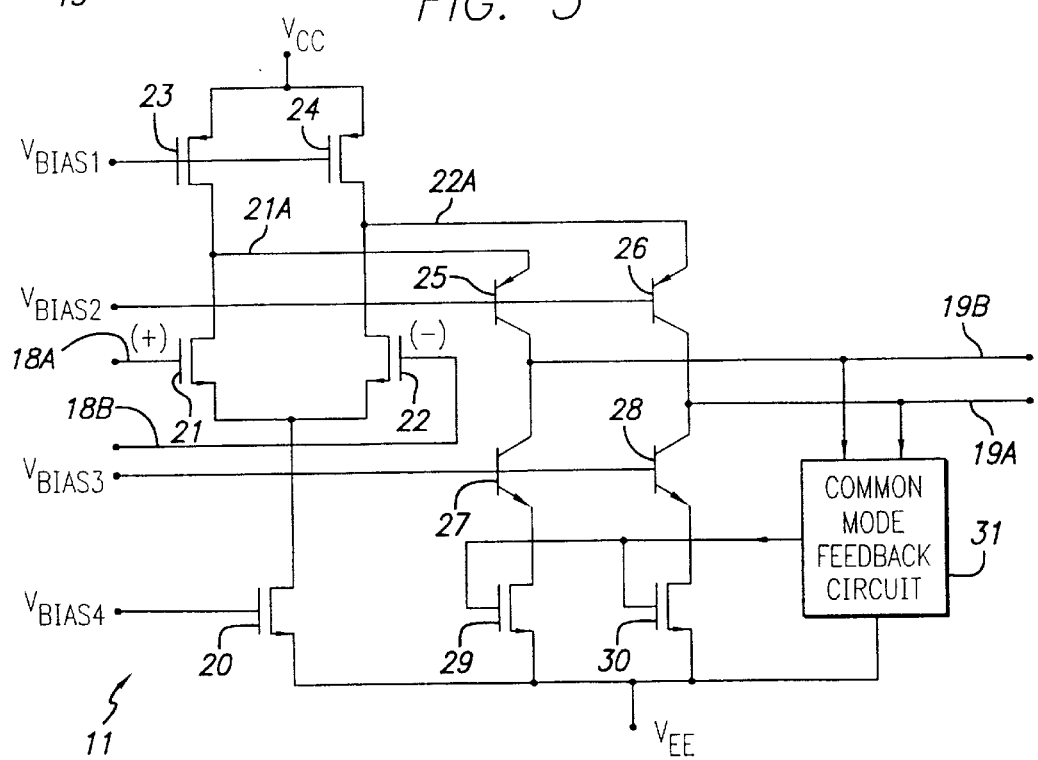
FIG. 3 is a schematic diagram of the operational transconductance amplifier (OTA) included in FIG. 2A.

Although OTA 11 is shown as a differential circuit, in some applications the single DAC, multiple sample/hold conversion circuit 10 could be implemented with a single-ended OTA. For example, in one implementation, the input stage of OTA 11 including transistors 21, 22, 23, 24, and 20 as shown in FIG. 3 could be modified to eliminate $V_{BIAS1}$ and connect conductor 21A to the gates of transistors 23 and 24. This would configure transistors 23 and 24 as an "active load" circuit, and would convert the input stage to a single-ended amplifier having conductor 22A as the single output. Conductor 21A could still be used as a second differential output that would effectively provide the common mode output voltage (and eliminate the need for a common mode feedback circuit), but could cause a reduction in the output voltage range and reduce the slew rate in one direction. If the reduced slew rate would be acceptable, the single-ended configuration would conveniently replace the usual common mode circuitry with a much simpler connection while nevertheless providing the common mode noise rejection benefits of having two hold capacitors.

Figure 8:
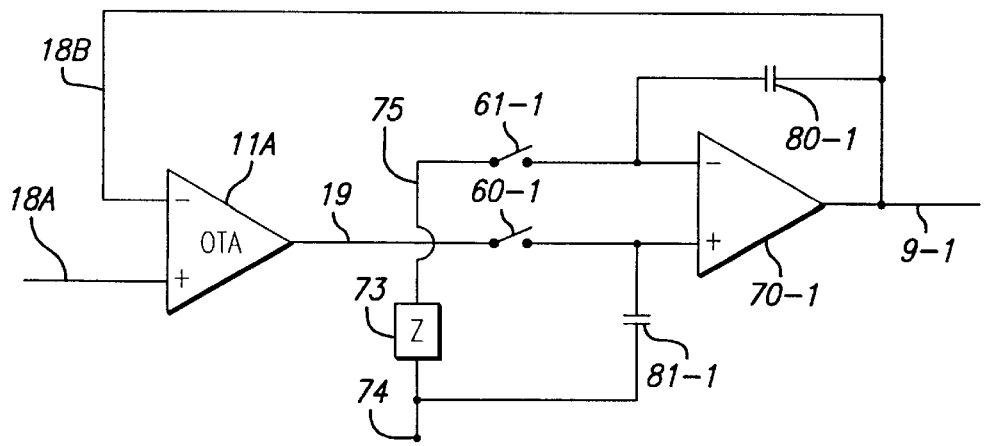
FIG. 8 is a block diagram illustrating a way of modifying the embodiment of FIG. 2A to utilize an operational transconductance amplifier 11 having a single-ended output.

A single-ended output OTA as shown in FIG. 8 can be used in the following manner. The (+) output 19 is the single ended output. Conductor 19 is connected to the left terminals of sampling switches 60-1. Conductor 75 is connected to the left side of switch 61-1 and also preferably to one terminal of an impedance matching circuit 73, the other terminal of which is connected to a common-mode voltage reference or ground terminal designated by reference numeral 74. (However, conductor 75 could be connected directly to terminal 74 if desired.) The impedance matching circuit 73 is designed to match the output impedance of OTA 11A. The impedance optimizes the matching of the charge distribution behavior between the two switches 60 and 61. In this way, the advantages having of two hold capacitors, with regard to droop and pedestal errors and switching transient cancellation, is retained while eliminating the need for common-mode feedback in the OTA. By connecting the hold capacitor 81-1 now grounded side to the same common-mode voltage reference as hold capacitor 80-1 during the acquisition mode, the common-mode noise rejection inherent in differential architectures is retained.

Also, although two hold capacitors are used in each sample/hold circuit 90 shown in FIG. 2A, in some applications multiple sample/hold circuit 10 could be implemented with a single-ended OTA and using only a single hold capacitor in each sample/hold circuit 90. For example, in one implementation, hold capacitor 80-1 in FIG. 2 could be replaced with a short-circuit and sampling switch 61-1 could be eliminated. While not providing common-mode rejection of the above mentioned errors, the sampling switch 60-1 would be within the feedback loop, and additional circuitry to compensate for errors such as offset, linearity, drift, etc. previously required of each output 7 could be combined into one OTA 11, reducing die size and cost, and improving channel-to-channel matching. ("Matching" means that the same code programmed to each output gives the exact same analog result, including error) This is inherent if the same DAC produces all the outputs, as opposed to a separate DAC, with separate error, for each output.)

Referring to FIG. 3, the OTA 11 used in FIG. 2A is a fully differential folded cascode operational transconductance amplifier including an input stage, a folded cascode stage, and a common mode feedback circuit. The input stage includes N-channel input transistors 21 and 22 having their sources connected to the drain of an N-channel tail current source transistor 20. The gate of transistor 20 is connected to a bias voltage $V_{BIAS4}$, and the source of transistor 20 is connected to the low power supply voltage $V_{EE}$. The gate of input transistor 21 is connected to conductor 18A, and the gate of input transistor 22 is connected to conductor 18B. The drain of transistor 21 is connected by conductor 21A to the drain of a P-channel load transistor 23 and to the emitter of a PNP transistor 25. The source of load transistor 23 is connected to the high power supply voltage $V_{CC}$. Similarly, the drain of input transistor 22 is connected by conductor 22A to the drain of a P-channel load transistor 24 and to the emitter of a PNP transistor 26. The source of load transistor 24 is connected to $V_{CC}$. The gates of load transistors 23 and 24 are connected to a bias voltage $V_{BIAS1}$. The bases of transistors 25 and 26 are connected to a bias voltage $V_{BIAS2}$. The collector of transistor 25 is connected to output conductor 19B and to the collector of an NPN cascode transistor 27. The emitter of cascode transistor 27 is connected to the drain of an N-channel current mirror transistor 29 having its source connected to $V_{EE}$. Similarly, the collector of transistor 26 is connected to output conductor 19A and to the collector of an NPN cascode transistor 28. The emitter of cascode transistor 28 is connected to the drain of an N-channel current mirror transistor 30 having its source connected to $V_{EE}$. The gates of current mirror transistors 29 and 30 are connected to the output of a conventional common mode feedback circuit 31 having its inputs connected to conductors 19A and 19B. The bases of cascode transistors 27 and 28 are connected to a bias voltage $V_{BIAS3}$.

The feedback switches 16-1,2 . . . 8 in FIG. 2 can be implemented using conventional CMOS transmission gates, each of which includes a P-channel switch transistor and an N-channel switch transistor connected in parallel with the P-channel switch transistor, with control signals which are logical complements being applied to their respective gates.

Figure 4:
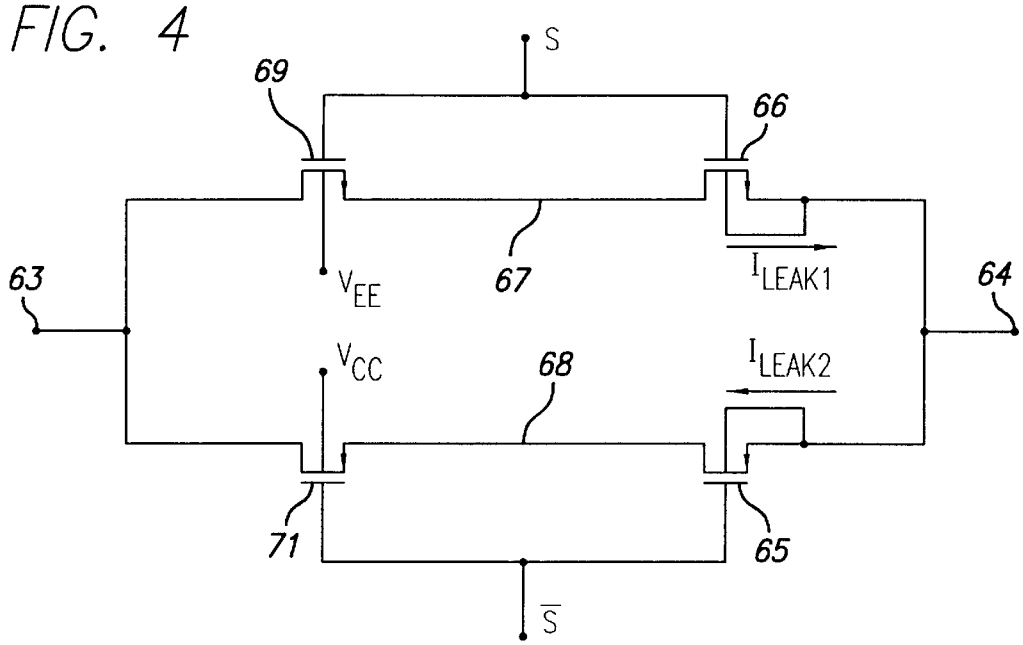
FIG. 4 is a schematic diagram of an analog switch circuit utilized to implement the sampling switches in FIG. 2A.

However, the requirements for the sampling switches 80-1,2 . . . 8 and 81-1,2 . . . 8 are more complex. FIG. 4 shows the schematic diagram of a circuit used to implement each of sampling switches 60 and 61 in FIG. 2A. Each analog switch circuit has one terminal that is labeled by numeral 63 and another terminal which is labeled by numeral 64. An N-channel transistor 69 has its drain connected to terminal 63, its source connected to conductor 67, its body electrode connected to $V_{EE}$, and its gate connected to a control signal S. An N-channel transistor 66 has its drain connected conductor 67, its source and its body electrode connected to terminal 64, and its gate connected to control signal S. Similarly, a P-channel transistor 71 has its drain connected to terminal 63, its source connected to conductor 68, its body electrode connected to $V_{CC}$, and its gate connected to a control signal $\overline{S}$, which is the logical complement of S. A P-channel transistor 65 has its drain connected conductor 68, its source and body electrode connected to terminal 64, and its gate connected to $\overline{S}$. The switch control signals S and $\overline{S}$ for each analog switch circuit are supplied by the various switch control buses 14-1,2 . . . 8. (Those skilled in the art will recognize that a field effect transistor is bilateral in the sense that its source and drain are functionally interchangeable. Therefore, the arrows in the drawings indicating the source electrodes of the MOSFETs (metal oxide semiconductor field effect transistors) are intended to identify the electrodes, not to limit their functions to being source electrodes. Similarly, in the claims the terms "source" and "drain" may be used to identify a particular physical terminal of a field effect transistor but do not necessarily limit the terminal to functioning only as a source or only as a drain.)

The analog switch circuit of FIG. 4 operates to at least partially cancel the effects of parasitic body-to-source reverse PN junction leakage currents that tend to erroneously charge or discharge the hold capacitors 80 and 81 during the hold mode of each sample/hold circuit 90, causing the above described sample/hold output voltage droop problem. In FIG. 4, a reverse PN junction leakage current $I_{LEAK1}$ flows from the P-type body or "bulk" region of transistor N-channel 66 to its N-type source region in the direction shown. That tends to cancel a similar reverse PN junction leakage current $I_{LEAK2}$ that flows from the P-type source region to the N-type body region of P-channel transistor 65. The cancellation tends to reduce the net parasitic charging/discharging of the hold capacitors during the hold mode of each sample/hold circuit 90 to the difference between $I_{LEAK1}$ and $I_{LEAK2}$.

Also, the analog switch circuit of FIG. 4 operates to cancel errors due to parasitic charge redistribution that occurs when the sampling switches 80 and 81 undergo a transition from being opened to being closed, because gate-to-source charge injection into the hold capacitor connected to terminal 64 is of opposite polarity for transistors 65 and 66 as a result of the transitions of $\overline{S}$ turning both-transistors off, and also because transistor 66 is a P-channel device and transistor 65 is an N-channel device. The amount of this accumulated channel charge is primarily a function of the gate-to-source voltages of transistors 65 and 66 and of various integrated circuit device processing parameters. The degree to which these gate-to-source voltages and various parameters can be matched in the semiconductor processing and the degree to which the timing, amplitudes, and waveshapes of the sampling switch control signals S and $\overline{S}$ can be optimized determines the degree to which accumulated or residual channel charge passes through the terminal 64 to the hold capacitor connected thereto and thus the degree to which the sample/hold output voltage is affected.

Figure 5:
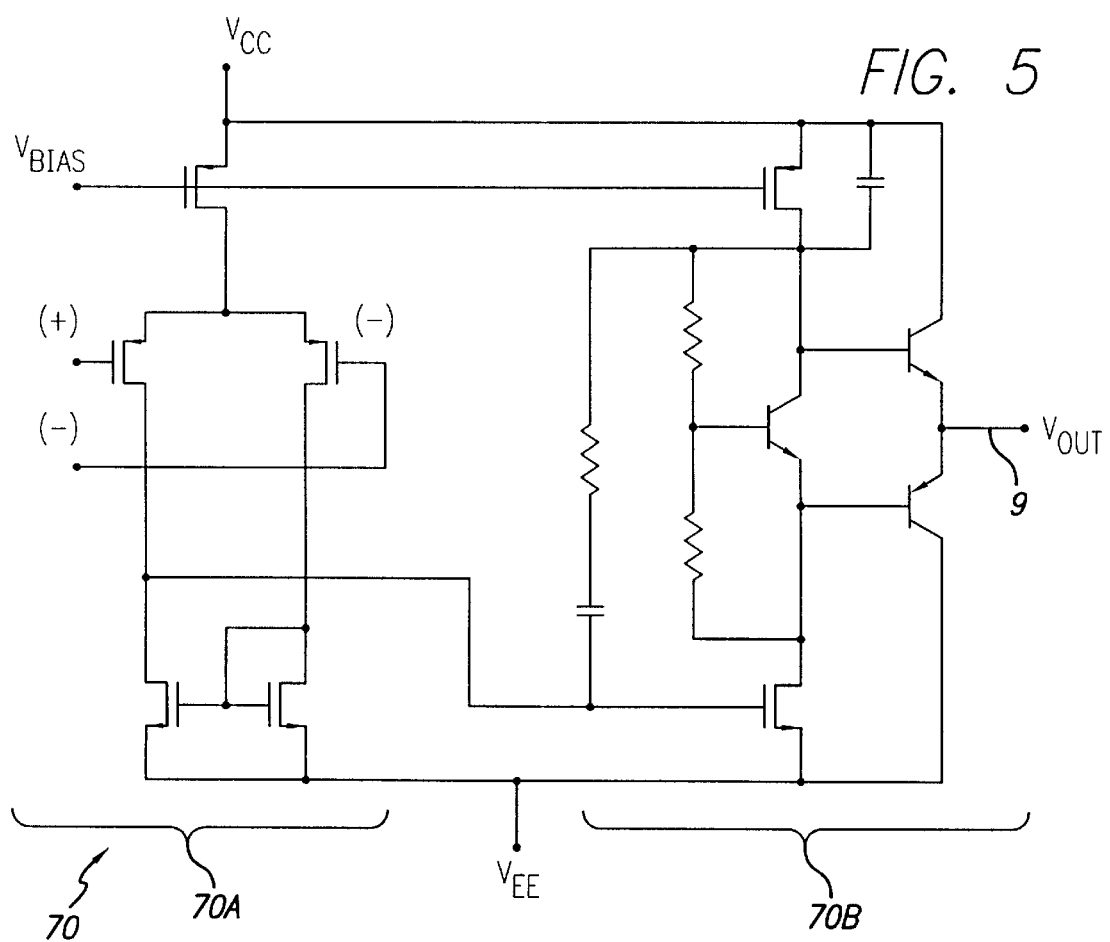
FIG. 5 is a schematic diagram of an output amplifier utilized in the multiple sample/hold conversion circuits in FIG. 2A.

FIG. 5 is a schematic diagram of the output amplifier 70 of each sample/hold circuit 90 in FIG. 2A. Output amplifier 70 includes a differential input section 70A and an output stage 70B, both of which are of conventional design and are shown for completeness.

Figure 6A:
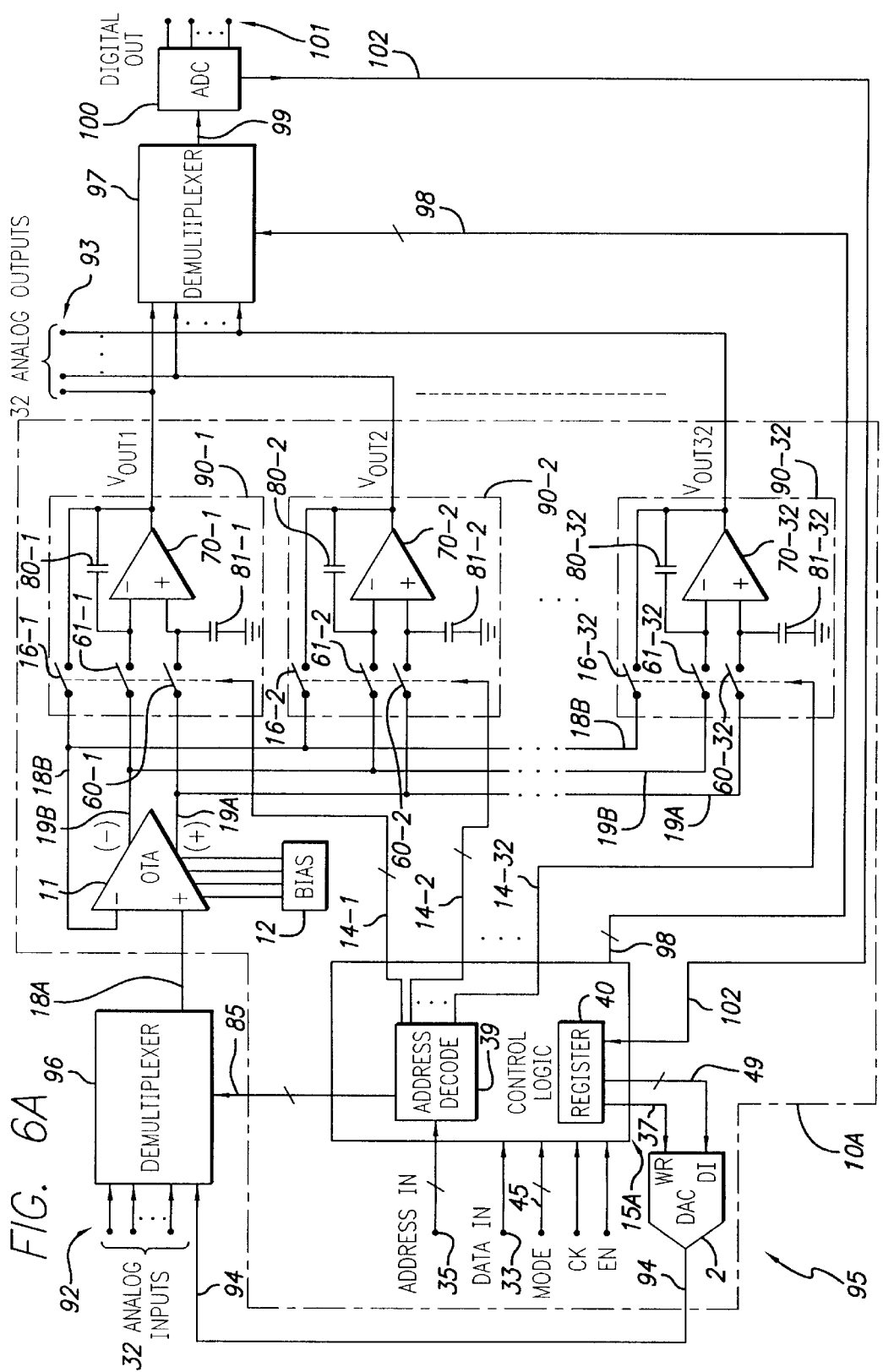
FIG. 6A is a block diagram of another embodiment of the invention.

FIG. 6A shows a block diagram of a programmable multiple sample/hold conversion circuit 95 which can be programmed to perform a number of different functions, including the function of 32 sample/hold circuits, 32 DACs, or 32 ADCs (analog-to-digital converters). Multiple sample/hold conversion circuit 95 includes a section 10A that includes a single DAC, multiple sample/hold conversion circuit similar to the one shown in previously described FIG. 2A. The OTA 11, bias circuit 12, and 32 sample/hold circuits 70-1,2 . . . , analog switches 60-1,2 . . . and 61-1,2 . . . and hold capacitors 80-1,2 . . . and 81-1,2 . . . are the same as in FIG. 2A. However, the configuration of control logic 15A is different in the multiple sample/hold conversion circuit 95 of FIG. 6A, which is shown in more detail in subsequently described FIG. 6B. In FIG. 6A, the output of DAC 2 is connected by conductor 94 to an input of a demultiplexer 96, rather than to the (+) input of OTA 11. 32 analog inputs 92 also are coupled to additional inputs of demultiplexer 96, the output of which is connected by conductor 18A to the (+) input of OTA 11. Demultiplexer 96 is controlled by selection signals 85 produced by control logic circuit 15A.

Multiple sample/hold conversion circuit 95 of FIG. 6A also includes a demultiplexer 97 having 32 analog inputs connected to corresponding analog outputs 93 of sample/hold circuits 70-1,2 . . . 32. Demultiplexer 97 has an output 99 connected to the input of a single ADC 100 which produces a desired number of digital output bits 101 (e.g., 16–20 digital output bits). Demultiplexer 97 is controlled by selection signals 98 produced by control logic circuit 15A.

Figure 6B:
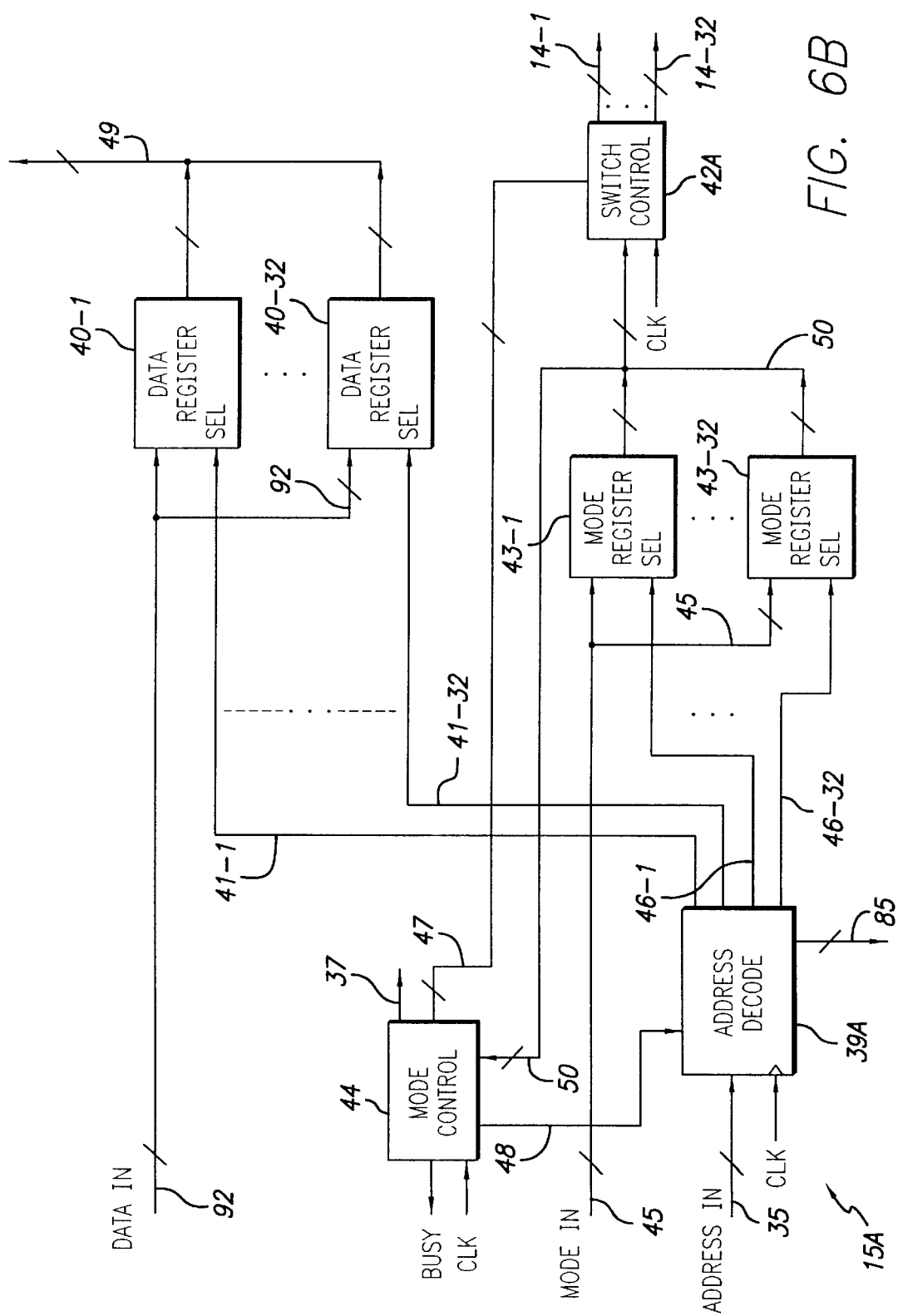
FIG. 6B is a detailed block diagram of one implementation of the control logic circuit 15A shown in FIG. 6A.

Referring to FIG. 6B, mode control circuit 15A includes a mode control circuit 44 that receives inputs via bus 50 from each of 32 mode registered circuits 43-1,2 . . . 32 that receive MODE IN signals on bus 45. The outputs of mode register circuits 43-1,2 . . . 32 also are connected by bus 50 to the inputs of a switch control circuit 42A. Mode control circuit 44 produces a BUSY signal as an output. Mode control circuit 44 also generates output signals on bus 47 that are applied to inputs of switch control circuit 42A. Mode control circuit 44 also generates the WR signal on conductor 37. Switch control circuit 42A produces the above described switch control signals on switch control buses 41-1,2 . . . 32. Mode control circuit 44 also produces outputs on conductor 48 which are applied to an input of address decode circuit 39A. Address decode circuit 39A also receives ADDRESS IN on bus 35 and produces corresponding selection signals on conductors 41-1,2 . . . 32 which are applied to selection inputs of 32 data registers 40-1,2 . . . 32, respectively. Address decode circuit 39A also produces the selection signals on bus 85 in response to ADDRESS IN. The inputs of data registers 40-1,2 . . . 32 are connected to receive DATA IN on bus 92. The outputs of data registers 40-1,2 . . . 32 are connected by bus 49 to the data input port DI of DAC 2 in FIG. 6A.

Depending on the mode of operation selected, control logic circuit 15A receives a digital address signal ADDRESS IN that corresponds to which one of 32 external digital signal sources (not shown) is providing the present digital data input signal DATA IN to be digitized. ADDRESS IN is decoded by address decoder circuit 39 to control (via one of switch control buses 14) which one of the 32 external analog signal sources (not shown) and the analog output 94 of DAC 2 is providing the present analog input signal to be digitized or is providing the present analog input signal to be sampled and held and presented to a corresponding one of the 32 analog outputs 93.

Mode control circuit 44 provides an interface to allow a user to individually control each of the outputs in accordance with whether the channel associated with that output is programmed to be a DAC output, an ADC output, a sample/hold output, or an "infinite" (i.e., repetitively refreshed) sample/hold output. More specifically, mode control circuit 44 controls the writing of data into DAC 2 via bus 49 and write control conductor 37 and also controls operation of switch control buses 14-1,2 . . . 32. Mode control circuit 44 also controls the configuration of the multiplexers 96 and 97 as needed to control the various outputs. Mode control circuit 44 can operate to receive programming information MODE IN on bus 45 that allows the user to configure each sample/hold channel separately with respect to the others. For example, the system 95 shown in FIG. 6A can be configured so that one or more of the analog inputs 92 are sampled and held while the system 95 is also configured to receive one or more DATA IN words via bus 92 and convert them to corresponding analog outputs on bus 93, and also is configured to receive several other analog inputs 92 and convert them to corresponding digital output numbers 101. Mode control circuit 44 also controls the internal switching required to accomplish the various foregoing programmable sample/hold channel functions and to accomplish associated optional refresh operations.

That is, mode control circuit 44 enables each separate sample/hold channel to function as conventional sample/hold circuit, as a refreshable sample/hold circuit, as part of a DAC, or as part of an ADC by routing and refreshing the appropriate register data and switch configuration data.

Mode control circuit 44 can be readily implemented in a variety of ways, including by use of ordinary combinational logic implemented, for example, in an ASIC, or it can be implemented utilizing a processor or microcontroller that is included in mode control circuit 44. Alternatively, the programmable functions of mode control circuit 44 can be performed by software executed in an external computer coupled to mode control circuit 44.

In the multiple input, single ADC configuration, many analog signals 92 can be sampled in rapid succession as fast as the settling time of the sample/hold circuits 70 permits, and then can be converted into corresponding digital output words separately without the need of multiple ADCs, one for each channel, or a single high speed ADC capable of converting each analog signal in succession within the minimum desired time period, thereby reducing die size, cost, and power consumption. (A high speed ADC can be used to convert one input, switch to the next, convert it, but is limited by the speed at which the ADC can convert. This involves tradeoffs including power, accuracy, input range, and more. A single, less expensive, less power, more accuracy (because it has more time) ADC can convert at its relative "leisure" once each input is captured and held.) As an alternative, additional OTAs could be provided so that this OTA 11 does not have to drive all 32 sample/hold circuits 90. For example, 4 OTAs can be provided such that each one drives 8 of the sample/hold circuits 90, in which case 4 of the analog signals 92 could be sampled and held simultaneously.

In one mode of operation of multiple sample/hold conversion circuit 95, control logic circuit 15A switches DATA IN to the digital input 13 of the of DAC 2 and causes demultiplexer 96 to switch the analog output signal 94 produced by DAC 2 to the (+) input of OTA 11. Control logic circuit 15A and also switches the outputs 19A and 19B of OTA 11 onto the 2 hold capacitors 80 and 81 of the one of sample/hold circuits 70 selected by control logic circuit 15A via one of the switch control buses 14 in response to ADDRESS IN. The resulting sampled and held analog signal appears on the corresponding analog output conductor 93. The same process is repeated for the digital signals 33 from any desired additional external digital signal sources and corresponding address inputs 35.

In another mode of operation of multiple sample/hold conversion circuit 95, logic circuit 15A causes demodulator 96 to switch one of the 32 analog inputs 92 determined by the ADDRESS IN onto the (+) input of OTA 11. Control logic circuit 15A also causes the outputs 19A and 19B of OTA 11 to charge up the hold capacitors 80 and 81 of the one of sample/hold circuits 70 determined by the same value of ADDRESS IN, causing the sampled and held analog voltage to appear on the corresponding conductor of analog output 93. This process can be repeated for as many of analog inputs 92 as desired.

This mode of operation can be enhanced by causing control logic circuit 15A to cause demultiplexer 97 to switch the selected analog output 93 to the input of ADC 100, which converts the selected analog output 93 to a digital number and provides that digital number via DOS 102 as an input into a register 40 in control logic circuit 15A. Control logic circuit 15A then repeatedly provides that digital number in register 40 as a digital input to DAC 2 and also causes demultiplexer 96 to switch the corresponding output of DAC 2 to the (+) of OTA 11, which then repetitively re-charges the corresponding hold capacitors. In this enhanced mode of operation, the sampled and held analog signals can be refreshed for as long as desired without resampling the corresponding original analog input 92.

Finally, in another mode of operation, multiple sample/hold conversion circuit 95 operates to select various ones of analog inputs 92, switch them into the (+) input of OTA, charge the hold capacitors of the corresponding sample/hold circuits 70, operate demultiplexer 97 to switch the sampled and held analog output signals 93 to the input of ADC 100, and produce corresponding digital output signals 101.

In all of the above operating modes, the architecture of the sample/hold conversion circuitry 10A produces the same advantages described above with reference to FIG. 2A.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

For example, a simple "always on" or a "on only during transition" feedback loop could be provided that is easily overdriven by the sample/hold outputs 9 so that OTA 11 always remains in a closed feedback loop, irrespective of the timing of the opening and closing of the sampling switches 60 and 61 and the feedback switches 16. Similarly, the OTA 11 outputs can be clamped to the common-mode voltage during transitions. Both methods ensure that the OTA output remains at the common-mode voltage at all times, minimizing switching transients at the output. For example, in some applications OTA 11 could be an operational amplifier having a "voltage output" instead of an operational transconductance amplifier having a "current output". The term "operational amplifier" is intended to encompass an operational transconductance amplifier. Although the output of DAC 2 as disclosed is a "voltage output", in some applications DAC 2 could be provided with a "current output" and correspondingly OTA 11 could be provided with a "current input" input stage, and so forth. Although DAC 2 is disclosed as providing a single-ended output on conductor 18A, those skilled in the art could readily provide DAC 2 with a differential output and provide corresponding differential signal paths for OTA 11 and the sample/hold circuits 90. The configuration of OTA 11 can be modified to accept a differential input by modifying the feedback circuitry or by adding a second OTA. In the latter case, two sample/hold circuits, each consisting of one OTA, one output amplifier, and associated switches operate to sample and hold both inputs simultaneously, which allows use of any combination of single or differential inputs and outputs. The inclusion of demultiplexer 96 in FIG. 6A enables any two inputs, including differential outputs from DAC 2, to be configured differentially. Similarly, inclusion of demultiplexer 97 in FIG. 6A enables any two outputs to be configured as differential inputs to the ADC. If a simple sample/hold circuit including OTA 11 and a single sample/hold circuit 90 is provided (without use of DAC 2 or control logic circuit 15), then the feedback switch 16 can be replaced by a short-circuit. If DAC 2, demultiplexer 97, and ADC 100 in FIG. 6A are omitted, and ADDRESS IN includes a first portion to be decoded to produce the address selection signals 85 and a second portion to be decoded to select the switch control buses 14 and produce the switch control signals thereon, then the resulting circuit is an analog switch matrix circuit in which any of the 32 analog inputs 92 can be multiplexed to any of the 32 analog outputs 93. In FIG. 6A, if demultiplexer 97 is omitted and the input 99 of ADC 100 is coupled directly to the output of one of the sample/hold circuits 90, for example 90-1, than any of the 32 analog inputs 92 can be converted to a digital output 101, as long as sample/hold circuit 90-1 samples and holds a voltage corresponding to that analog input long enough for the analog-to-digital conversion to be performed by ADC 100.

What is claimed is:

1. A method of converting a plurality of digital words to corresponding analog signals, comprising:

(a) applying a first digital word to a digital input of a digital-to-analog converter;

(b) decoding a first digital address that corresponds to the first digital word to produce a plurality of switch control signals;

(c) operating the digital-to-analog converter to convert the first digital word to a first analog voltage;

(d) applying the first analog voltage to the first input of an operational amplifier;

(e) closing a first sampling switch of a first sample/hold circuit in response to a first sampling switch control signal corresponding to the first digital address to charge a first hold capacitor of the first sample/hold circuit to the first analog voltage, and closing a first feedback switch of the first sample/hold circuit in response to a first feedback switch control signal corresponding to the first digital address to couple an output voltage of the first sample/hold circuit to a second input of the operational amplifier to produce a first sample/hold output voltage representative of the first digital word;

(f) opening the first sampling switch and the first feedback switch; and (g) repeating steps (a) through (f) for a second digital word and a second digital address corresponding to the second digital word to produce a second sample/hold output voltage representative of the second digital word on an output of a second sample/hold circuit.

2. A sample/hold circuit comprising:

(a) an output amplifier, a first hold capacitor coupled to a first input of the output amplifier and a first terminal of a first sampling switch, a second hold capacitor having a first terminal coupled to a second input of the output amplifier and to a first terminal of a second sampling switch and a second terminal coupled to an output of the output amplifier, and a feedback element coupled to the output of the output amplifier;

(b) an operational amplifier having a first input for receiving an analog input voltage, a second input, a first output coupled to a second terminal of the first sampling switch, and a second output coupled to a second terminal of the second sampling switch, the second input of the operational amplifier being coupled to the feedback element; and (c) an element coupled to control terminals of the first and second sampling switches for conducting a switch control signal for closing the first and second sampling switches to cause the sample/hold circuit to sample the analog input voltage by charging the first and second hold capacitors to voltages on the first and second outputs of the operational amplifier, respectively, and for opening the first and second sampling switches to cause the sample/hold circuit to hold the sampled analog input voltage.

3. The sample/hold conversion circuit of claim 2 wherein each of the first and second sampling switches includes first and second N-channel transistors each having a gate coupled to a control signal and first and second P-channel transistors each having a gate coupled to a logical complement of the control signal, the first N-channel transistor having a first electrode coupled to the second terminal of the first sampling switch and a second electrode coupled to a first electrode of the second N-channel transistor, a body electrode of the first N-channel transistor being coupled to a low supply voltage, a second electrode of the second N-channel transistor being coupled to the first terminal of the first sampling switch, the first P-channel transistor having a first electrode coupled to the second terminal of the first sampling switch and a second electrode coupled to a first electrode of the second P-channel transistor, a second electrode of the second P-channel transistor being coupled to the first terminal of the first sampling switch, a body electrode of the first P-channel transistor being coupled to a high supply voltage.

4. The sample/hold circuit of claim 3 wherein the second electrode and the body electrode of the second N-channel transistor are connected together, and wherein the second electrode and the body electrode of the second P-channel transistor are connected together.

5. A multiple sample/hold circuit comprising:

(a) a plurality of sample/hold circuits each including an output amplifier, a first hold capacitor coupled to a first input of the output amplifier and a first terminal of a first sampling switch, and a feedback switch having a first terminal coupled to an output of the output amplifier;

(b) an operational amplifier having first and second inputs, a first output coupled to a second terminal of the first sampling switch, the second input of the operational amplifier being coupled to a second terminal of the feedback switch;

(c) circuitry for applying a selected analog signal to the first input of the operational transconductance amplifier;

(d) a control logic circuit for receiving an address input and selecting one of a plurality of switch control buses in response to the address input, each switch control bus being coupled to control the feedback switch and the first sampling switch of a corresponding sample/hold circuit, the control logic circuit producing switch controls signals on the selected switch control bus to control the feedback switch and the first sampling switch of the corresponding sample/hold circuit.

6. The multiple sample/hold circuit of claim 5 wherein the output amplifier of each output amplifier includes a second input coupled to the output of the sample/hold circuit.

7. The multiple sample/hold circuit of claim 5 wherein the first sampling switch includes first and second N-channel transistors each having a gate coupled to a control signal and first and second P-channel transistors each having a gate coupled to a logical complement of the control signal, the first N-channel transistor having a first electrode coupled to a first terminal of the first sampling switch and a second electrode coupled to a first electrode of the second N-channel transistor, a body electrode of the first N-channel transistor being coupled to a low supply voltage, a second electrode of the second N-channel transistor being coupled to a second terminal of the first sampling switch, the first P-channel transistor having a first electrode coupled to the first terminal of the first sampling switch and a second electrode coupled to a first electrode of the second P-channel transistor, a second electrode of the second P-channel transistor being coupled to the second terminal of the first sampling switch, a body electrode of the first P-channel transistor being coupled to a high supply voltage.

8. The multiple sample/hold circuit of claim 7 wherein the second electrode and the body electrode of the second N-channel transistor are connected together, and wherein the second electrode and the body electrode of the second P-channel transistor are connected together.

9. A multiple sample/hold circuit comprising:

(a) a plurality of sample/hold circuits each including an output amplifier, a first hold capacitor coupled to a first input of the output amplifier and a first terminal of a first sampling switch, a second hold capacitor having a first terminal coupled to a second input of the output amplifier and to a first terminal of a second sampling switch and a second terminal coupled to an output of the output amplifier, and a feedback switch having a first terminal coupled to the output of the output amplifier;

(b) an operational transconductance amplifier having first and second inputs, a first output coupled to a second terminal of the first sampling switch and a second output coupled to a second terminal of the second sampling switch, the second input of the operational transconductance amplifier being coupled to a second terminal of the feedback switch;

(c) circuitry for applying a selected analog signal to the first input of the operational transconductance amplifier; and (d) a control logic circuit for receiving an address input and selecting one of a plurality of switch control buses in response to the address input, each switch control bus being coupled to control the feedback switch, first sampling switch, and second sampling switch of a corresponding sample/hold circuit, the control logic circuit producing switch controls signals on the selected switch control bus to control the feedback switch, first sampling switch, and second sampling of switch of the corresponding sample/hold circuit.

10. The multiple sample/hold circuit of claim 9 wherein each of the first and second sampling switches includes first and second N-channel transistors each having a gate coupled to a control signal and first and second P-channel transistors each having a gate coupled to a logical complement of the control signal, the first N-channel transistor having a first electrode coupled to the second terminal of the first sampling switch and a second electrode coupled to a first electrode of the second N-channel transistor, a body electrode of the first N-channel transistor being coupled to a low supply voltage, a second electrode of the second N-channel transistor being coupled to the first terminal of the first sampling switch, the first P-channel transistor having a first electrode coupled to the second terminal of the first sampling switch and a second electrode coupled to a first electrode of the second P-channel transistor, a second electrode of the second P-channel transistor being coupled to the first terminal of the first sampling switch, a body electrode of the first P-channel transistor being coupled to a high supply voltage.

11. The multiple sample/hold circuit of claim 10 wherein the second electrode and the body electrode of the second N-channel transistor are connected together, and wherein the second electrode and the body electrode of the second P-channel transistor are connected together.

12. A multiple sample/hold circuit comprising:

(a) a plurality of sample/hold circuits each including an output amplifier, a first hold capacitor coupled to a first input of the output amplifier and a first terminal of a first sampling switch, a second hold capacitor having a first terminal coupled to a second input of the output amplifier and to a first terminal of a second sampling switch and a second terminal coupled to an output of the output amplifier, and a feedback switch having a first terminal coupled to the output of the output amplifier;

(b) an operational transconductance amplifier having first and second inputs, a first output coupled to a second terminal of the first sampling switch and a second output coupled to a second terminal of the second sampling switch, the second input of the operational transconductance amplifier being coupled to a second terminal of the feedback switch;

(c) a control logic circuit for receiving an address input and selecting one of a plurality of switch control buses in response to the address input, each switch control bus being coupled to control the feedback switch, the first sampling switch, and second sampling switch of a corresponding sample/hold circuit, the control logic circuit producing switch controls signals on the selected switch control bus to control the feedback switch, first sampling switch, and second sampling switch of the corresponding sample/hold circuit; and (d) a first demultiplexer coupled to the control logic circuit for switching a selected analog signal onto the first input of the operational transconductance amplifier in response to the address input.

13. A multiple sample/hold conversion circuit comprising:

(a) a plurality of sample/hold circuits each including an output amplifier, a first hold capacitor coupled to a first input of the output amplifier and a first terminal of a first sampling switch, a second hold capacitor having a first terminal coupled to a second input of the output amplifier and to a first terminal of a second sampling switch and a second terminal coupled to an output of the output amplifier, and a feedback switch having a first terminal coupled to the output of the output amplifier;

(b) an operational transconductance amplifier having first and second inputs, a first output coupled to a second terminal of the first sampling switch and a second output coupled to a second terminal of the second sampling switch, the second input of the operational transconductance amplifier being coupled to a second terminal of the feedback switch;

(c) a control logic circuit for receiving an address input and selecting one of a plurality of switch control buses in response to the address input, each switch control bus being coupled to control the feedback switch, first sampling switch, and second sampling switch of a corresponding sample/hold circuit, the control logic circuit producing switch controls signals on the selected switch control bus to control the feedback switch, first sampling switch, and second sampling switch of the corresponding sample/hold circuit;

(d) a digital-to-analog converter; and
(e) digital data control circuitry in the control logic circuit for storing a plurality of digital data input signals and routing a selected stored digital data output signal to an input of a digital-to-analog converter to cause the digital-to-analog converter to produce an analog signal corresponding to the selected digital data input signal on the first input of the operational transconductance amplifier.

14. The multiple sample/hold conversion circuit of claim 13 wherein each of the first and second sampling switches includes first and second N-channel transistors each having a gate coupled to a control signal and first and second P-channel transistors each having a gate coupled to a logical complement of the control signal, the first N-channel transistor having a first electrode coupled to the second terminal of the first sampling switch and a second electrode coupled to a first electrode of the second N-channel transistor, a body electrode of the first N-channel transistor being coupled to a low supply voltage, a second electrode of the second N-channel transistor being coupled to the first terminal of the first sampling switch, the first P-channel transistor having a first electrode coupled to the second terminal of the first sampling switch and a second electrode coupled to a first electrode of the second P-channel transistor, a second electrode of the second P-channel transistor being coupled to the first terminal of the first sampling switch, a body electrode of the first P-channel transistor being coupled to a high supply voltage.

15. The multiple sample/hold circuit of claim 14 wherein the second electrode and the body electrode of the second N-channel transistor are connected together, and wherein the second electrode and the body electrode of the second P-channel transistor are connected together.

16. The multiple sample/hold conversion circuit of claim 13 wherein the control logic circuit includes address decoder circuitry for producing switch controls signals on conductors of one of the switch control buses determined by the address input.

17. The multiple sample/hold conversion circuit of claim 13 wherein the control logic circuit includes a first demultiplexer for switching a selected analog signal or the analog signal corresponding to the selected digital data input signal onto the first input of the operational transconductance amplifier in response to the address input.

18. The multiple sample/hold conversion circuit of claim 17 including an analog-to-digital converter and a second demultiplexer for switching the output of the corresponding sample/hold circuit to an input of the analog-to-digital converter in response to the address input.

19. The multiple sample/hold conversion circuit of claim 18 wherein the control logic circuit includes digital data control circuitry for routing of a selected stored digital data input signal to an input of the digital-to-analog converter to cause the digital-to-analog converter to produce the corresponding analog signal signal on an input of the first demultiplexer.

20. The multiple sample/hold conversion circuit of claim 19 wherein the control logic circuit includes register circuitry coupled to receive and store a selected digital output signal produced by the analog-to-digital converter and circuitry programmable to refresh a particular sample/hold circuit by applying the selected stored digital output signal in the register circuitry to the digital input of the digital-to-analog converter and switching the output of the digital-to-analog converter through the first demultiplexer to the first input of the operational transconductance amplifier.

21. The multiple sample/hold conversion circuit of claim 17 including an analog-to-digital converter having an input coupled to the output of one of the sample/hold circuits.

22. The multiple sample/hold conversion circuit of claim 13 wherein the first hold capacitor is coupled to the first input of the output amplifier and a second terminal of the first hold capacitor is coupled to a fixed reference voltage.

23. A single-DAC, multiple sample/hold conversion circuit comprising:
(a) a digital-to-analog converter;
(b) a plurality of sample/hold circuits each including an output amplifier, a first hold capacitor coupled to a first input of the output amplifier and a first terminal of a first sampling switch, a second hold capacitor having a first terminal coupled to a second input of the output amplifier and to a first terminal of a second sampling switch and a second terminal coupled to an output of the output amplifier, and a feedback switch having a first terminal coupled to the output of the output amplifier; and
(c) an operational transconductance amplifier having first and second inputs, a first output coupled to a second terminal of the first sampling switch and a second output coupled to a second terminal of the second sampling switch, the first input of the operational transconductance amplifier being coupled to an output of the digital-to-analog converter, the second input of the operational transconductance amplifier being coupled to a second terminal of the feedback switch;
(d) a control logic circuit for receiving an address input, selecting one of a plurality of switch control buses in response to the address input, each switch control bus being coupled to control the feedback switch, first sampling switch, and second sampling switch of a corresponding sample/hold circuit, the control logic circuit producing switch controls signals on the selected switch control bus to control the feedback switch, first switch, and second switch of the corresponding sample/hold circuit, the control logic circuit including digital data control circuitry for routing a digital data input signal to an input of the digital-to-analog converter to cause the digital-to-analog converter to produce the selected analog signal signal on the first input of the operational transconductance amplifier.

24. A circuit for converting a plurality of digital words to corresponding analog signals, comprising:
(a) means for applying a first digital word to a digital input of a digital-to-analog converter;
(b) means for decoding a first digital address that corresponds to the first digital word to produce a plurality of switch control signals;
(c) means for operating the digital-to-analog converter to convert the first digital word to a first analog voltage;
(d) means for applying the first analog voltage to the first input of an operational transconductance amplifier;
(e) means for closing a first sampling switch of a first sample/hold circuit in response to a first sampling switch control signal corresponding to the first digital address to charge a first hold capacitor of the first sample/hold circuit to the first analog voltage in response to a first sampling switch control signal, and closing a first feedback switch of the first sample/hold circuit in response to a first feedback switch control signal corresponding to the first digital address to couple an output voltage of the first sample/hold circuit to a second input of the operational transconductance amplifier to produce a first sample/hold output voltage representative of the first digital word;

(f) means for opening the first sampling switch and the first feedback switch; and (g) means for repeating the functions of elements (a) through (f) for a second digital word and a second digital address corresponding to the second digital word to produce a second sample/hold output voltage representative of the second digital word on an output of a second sample/hold circuit.

25. The circuit of claim 24 including means for stabilizing the first and second output of the operational transconductance amplifier during intervals in which feedback switches of all of the sample/hold circuits are open.

26. The circuit of claim 25 wherein the means for stabilizing includes parasitic capacitance associated with the first and second outputs of the operational transconductance amplifier.

* * * * *